United States Patent
Tsai

(10) Patent No.: US 7,014,477 B2
(45) Date of Patent: Mar. 21, 2006

(54) ELECTRICAL CONNECTOR HAVING A TERMINAL CROSSING OVER TWO ADJACENT TERMINAL SLOTS

(76) Inventor: Chou Hsuan Tsai, 15F, No. 4, Lane 127, Sec. 1, Fu-Hsing Rd., Hsin-Chuang City, Taipei Hsien (TW)

( * ) Notice: Subject to any disclaimer, the term of this patent is extended or adjusted under 35 U.S.C. 154(b) by 0 days.

(21) Appl. No.: 11/104,967

(22) Filed: Apr. 12, 2005

(65) Prior Publication Data

US 2005/0233629 A1    Oct. 20, 2005

(30) Foreign Application Priority Data

Apr. 16, 2004 (TW) ............... 93110743 A
May 7, 2004 (TW) ............... 93113004 A

(51) Int. Cl.
*H01R 12/00* (2006.01)
(52) U.S. Cl. .................. 439/71; 439/331; 439/885
(58) Field of Classification Search ............ 439/71–72, 439/331, 885
See application file for complete search history.

(56) References Cited

U.S. PATENT DOCUMENTS

| 6,227,869 B1 * | 5/2001 | Lin et al. | 439/66 |
| 6,786,738 B1 * | 9/2004 | Lin | 439/71 |
| 6,957,987 B1 * | 10/2005 | Ma et al. | 439/733.1 |

* cited by examiner

*Primary Examiner*—Truc Nguyen
(74) *Attorney, Agent, or Firm*—Pro-Techtor Int'l Services

(57) ABSTRACT

An electrical connector having a terminal crossing over two adjacent terminal slots includes a base formed with terminal slots, and terminals disposed in the terminal slots. Each terminal has a fixing portion, an elastic arm and a pin. The fixing portion is clamped and positioned by the slot. The elastic arm has a lower arm and an upper arm. A bottom of the lower arm is connected to a bottom of the fixing portion. The lower arm extends from bottom to top. A top of the lower arm and the fixing portion define a gap. The upper arm extends, from the top of the lower arm, slantingly upwards through a top of the fixing portion to the adjacent terminal slot. A connection point is disposed near a distal end of the upper arm. The pin is positioned under the fixing portion and extends over a bottom of the base.

20 Claims, 8 Drawing Sheets

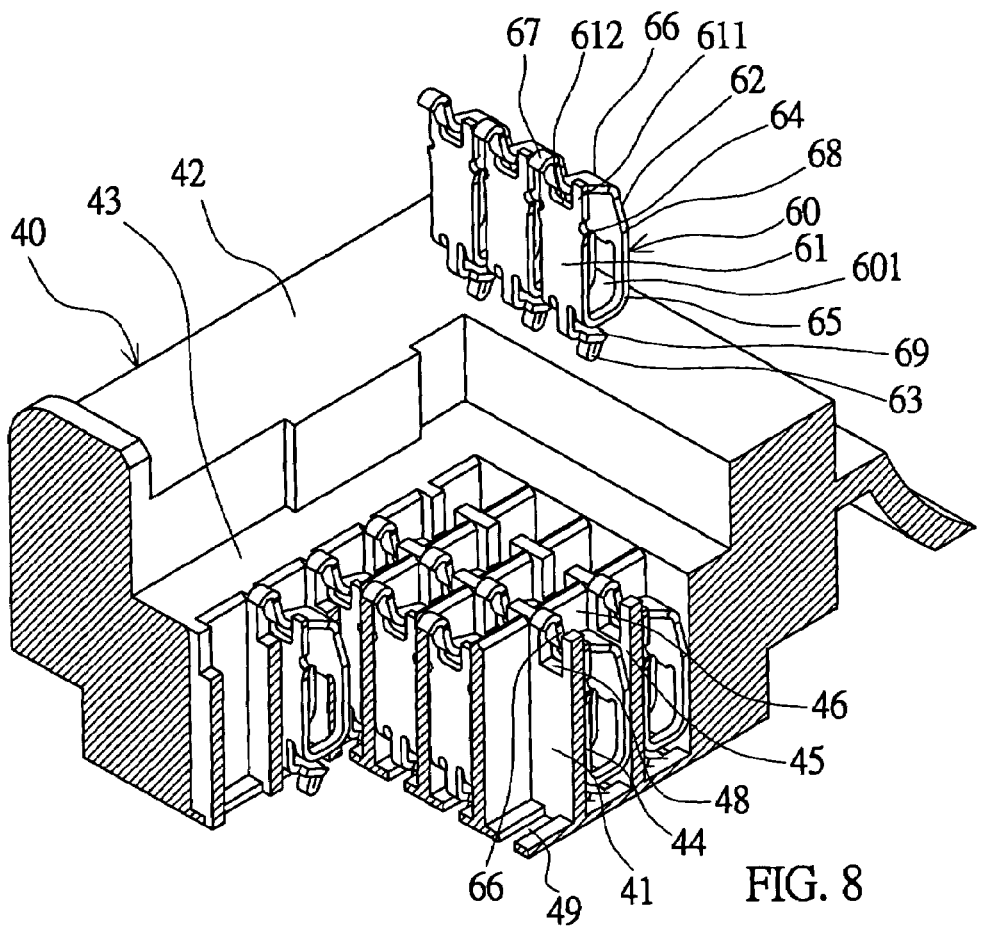
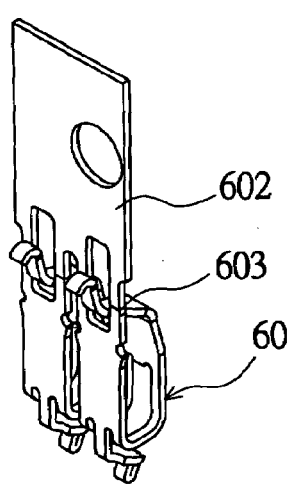
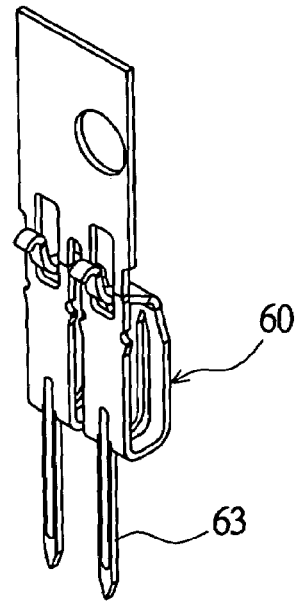
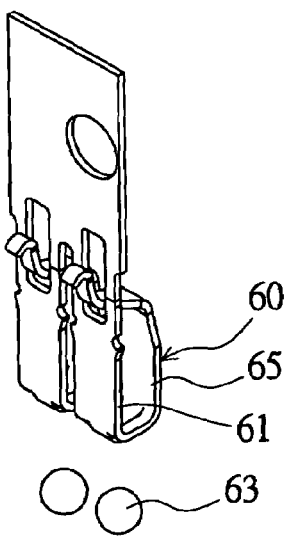
FIG. 8
FIG. 9　　FIG. 10　　FIG. 11

ELECTRICAL CONNECTOR HAVING A TERMINAL CROSSING OVER TWO ADJACENT TERMINAL SLOTS

BACKGROUND OF THE INVENTION

1. Field of the Invention

The invention relates in general to an electrical connector, and more particularly to an electrical connector with better elasticity.

2. Description of the Related Art

A bottom surface of a chip, such as a CPU, is formed with a plurality of connection points. A downward pressure is utilized to fix the chip to a base in such a kind of electrical connector such that the connection points of the chip elastically contact the terminals disposed in the terminal slots of the base and the electrical connection can be ensured.

Referring to FIG. 1, an electrical connector to be connected to a chip includes a base 10 formed with a plurality of terminal slots 11, and a plurality of terminals 14 disposed in the terminal slots 11 of the base, respectively. Each terminal has an elastic arm 15, which can be elastically moved up and down, and a fixing portion 16, which is clamped and fixed by the terminal slot 11. The elastic arm 15 is connected to the top of the fixing portion 16, and a protrudent connection point 17 is formed near the distal end thereof.

When a chip 90 is placed on the base 10, connection points 91 of the chip 90 contact the connection points 17 of the terminals 14, respectively. As shown in FIG. 2, when the chip 90 is pressed down, each terminal 14 retracts due to the elasticity of the elastic arm 15. At this time, the connection point 17 elastically presses against the connection point 91 to achieve the electrical connection effect.

The prior art structure has the following drawbacks. First, the terminal slot 11 is rectangular and is disposed on the base 10 and the terminal 14 is disposed in the terminal slot 11, so the elastic arm 15 only can extend in a limited length equal to the length of the terminal slot 11, and the elasticity thereof is not optimized. As the function of the CPU is getting more and more powerful, the number of connection points of the CPU is getting larger and larger. Thus, more and more terminal slots 11 have to be disposed in the base 10, and the length of the terminal slot is thus reduced. Consequently, the extensible length of the elastic arm 15 of the terminal 14 is also decreased, and the condition of the fatigue of the elastic arm tends to occur.

SUMMARY OF THE INVENTION

It is therefore an object of the invention to provide an electrical connector having a terminal crossing over two adjacent terminal slots, wherein an elastic arm of the terminal is curved from bottom to top, passes through a fixing portion, and extends to the adjacent terminal slot so that the terminal has an excellent elastic contact effect.

To achieve the above-mentioned object, the invention provides an electrical connector including a base and a plurality of terminals. The base is formed with a plurality of terminal slots spaced apart from one another. The terminals are disposed in the plurality of terminal slots of the base. Each of the terminals has a fixing portion, an elastic arm and a pin. The fixing portion is clamped and positioned by the terminal slot. The elastic arm has a lower arm and an upper arm. A bottom of the lower arm is connected to a bottom of the fixing portion. The lower arm extends from bottom to top. A top of the lower arm and the fixing portion define a gap. The upper arm extends, from the top of the lower arm, slantingly upwards through a top of the fixing portion to the adjacent terminal slot. A connection point is disposed near a distal end of the upper arm. The pin is positioned under the fixing portion and extends over a bottom of the base.

According to the above-mentioned structure, the elastic arm of the terminal can be extended very long such that the terminal has good contact elasticity.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 8 is a pictorially exploded view showing terminals and an inner seat according to the first embodiment of the invention.

FIG. 9 is a pictorial view showing the terminals according to the first embodiment of the invention.

FIG. 10 is a pictorial view showing terminals according to a second embodiment of the invention.

FIG. 11 is a pictorial view showing terminals according to a third embodiment of the invention.

DETAILED DESCRIPTION OF THE INVENTION

Figure 2:
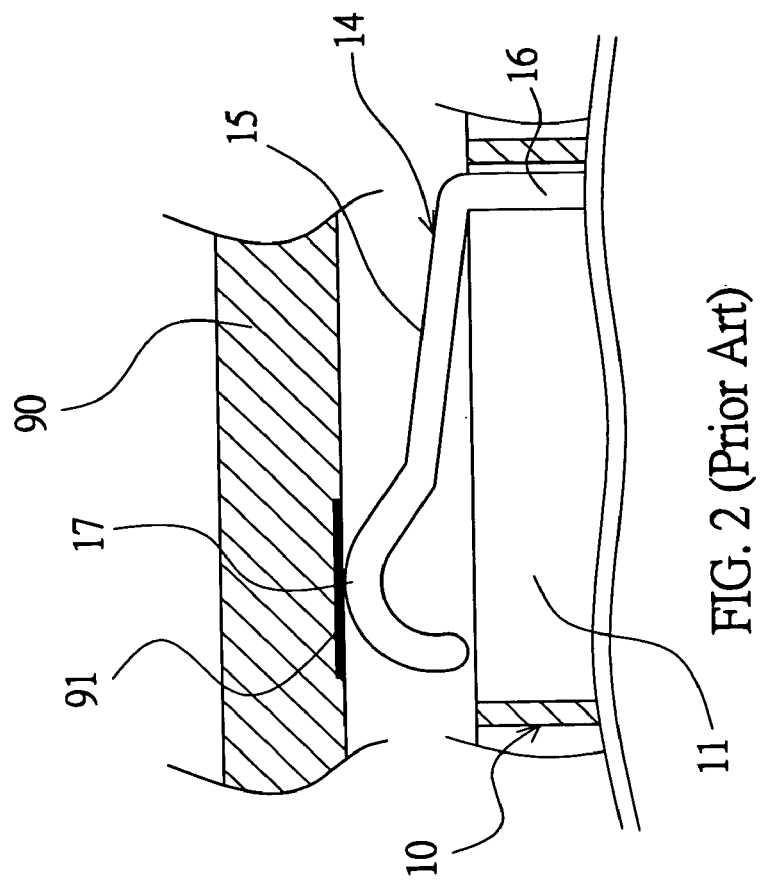
FIG. 2 shows a second usage state of the electrical connector and the chip according to the prior art.
Figure 1:
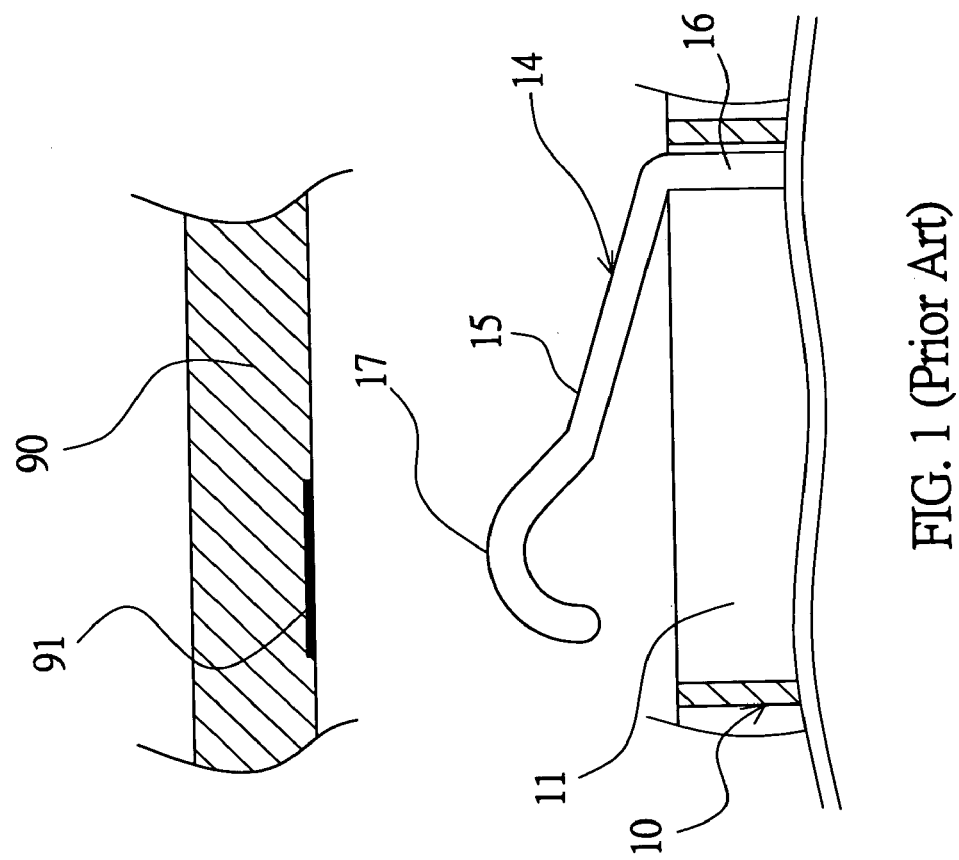
FIG. 1 shows a first usage state of an electrical connector and a chip according to the prior art.
Figure 3:
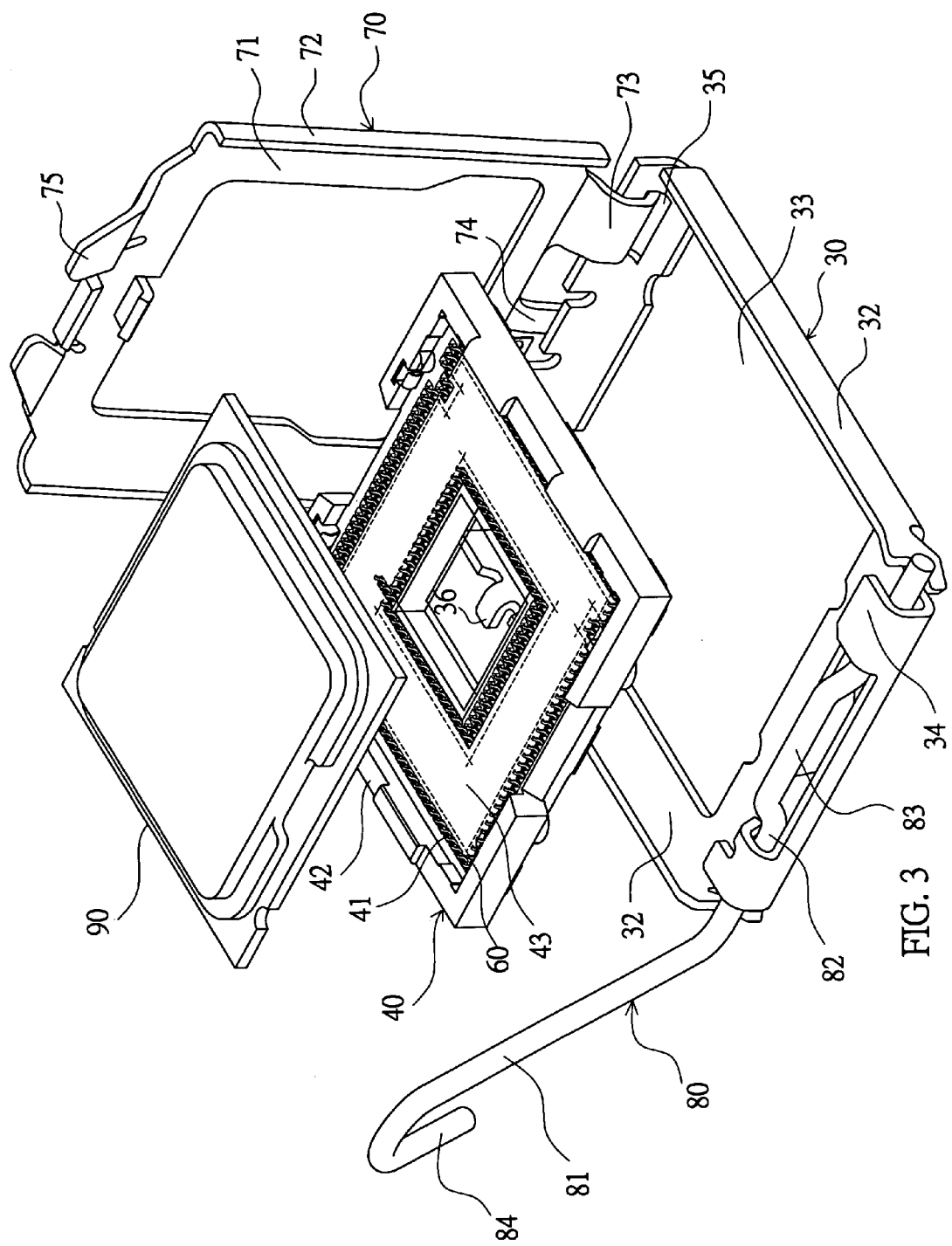
FIG. 3 is a pictorially exploded view showing an electrical connector according to a first embodiment of the invention.
Figure 4:
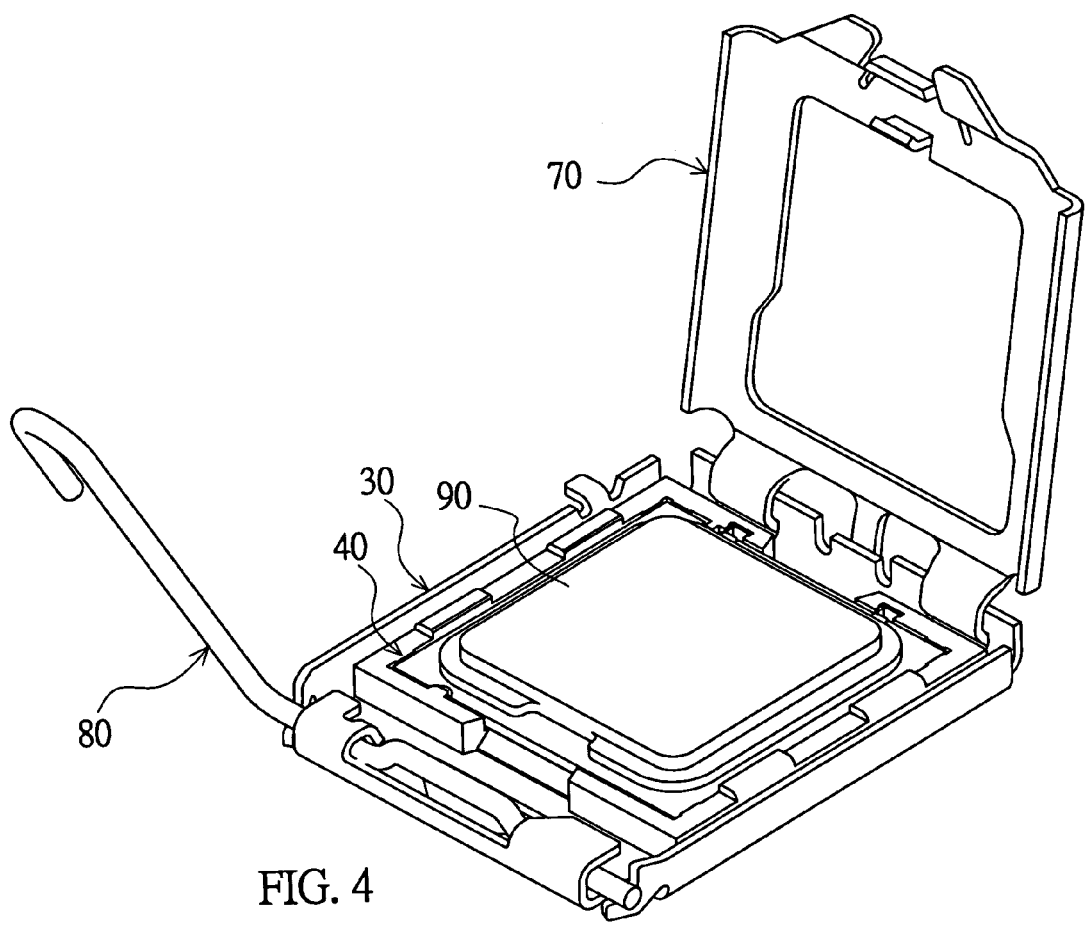
FIG. 4 is a pictorially assembled view showing the electrical connector according to the first embodiment of the invention.
Figure 5:
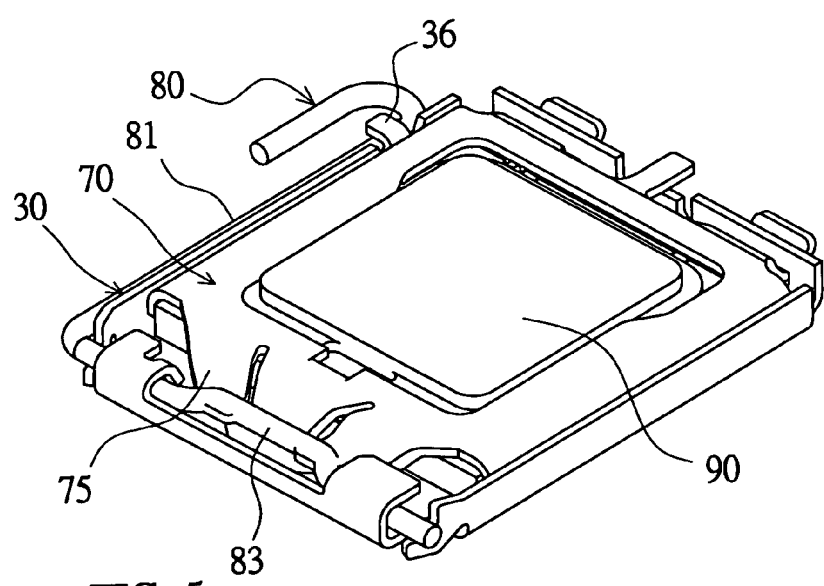
FIG. 5 is a pictorial view showing a usage state of the electrical connector according to the first embodiment of the invention.

Referring to FIGS. 3 to 7, an electrical connector of this embodiment includes a base, a plurality of terminals 60, an upper cover 70 and a lever 80.

The base includes a metallic outer seat 30 and a plastic inner seat 40. The outer seat 30 has a bottom surface 31 and two sidewalls 32. The bottom surface 31 has an opening 33 at a middle portion, a first pivot portion 34 at a front end, a hole-like second pivot portion 35 at a rear end, and a locking portion 36 at the other side. An inner seat 40 is fitted in the outer seat 30, and a plurality of terminal slots 41 spaced apart from one another is formed on the inner seat 40. A flange 42 enclosing a placement area 43 in which a chip 90 is placed is formed on a top of the inner seat 40. As shown in FIG. 8, each terminal slot 41 has a front wall 44, a rear wall 45 and two sidewalls 46. An upper edge of the front wall 44 is formed with a wall notch 48 communicating two adjacent terminal slots 41 to each other. The bottom surface of the terminal slot has a through hole 49.

The terminals 60 are disposed, from top to bottom, in the terminal slots 41 of the inner seat 40 of the base, and each of the terminals 60 has a fixing portion 61, an elastic arm 62 and a pin 63. The fixing portion 61 rests on the rear wall 45 of the terminal slot 41 and has two sides each formed with a projection 64 to be clamped and positioned by the two sidewalls 46 of the terminal slot. The top of the fixing portion 61 has two lateral sides 611 and a terminal notch 612 between the two lateral sides 611. The elastic arm 62 has a lower arm 65 and an upper arm 66. The bottom of the lower arm 65 connects with the bottom of the fixing portion 61 and the fixing portion 61 extends from bottom to top and rests on the front wall 44 of the terminal slot to form a U-shaped structure together with the fixing portion 61. A top 68 of the lower arm 65 and the fixing portion 61 define a gap. The upper arm 66 in one of the terminal slots extends, from the top 68 of the lower arm, slantingly upwards through the terminal notch 612 of the top of the fixing portion 61 and the wall notch 48 of the terminal slot to the adjacent terminal slot 41 adjacent to the one of the terminal slots. A connection point 67 projecting over the terminal slot 41 to the placement area 43 is disposed near a distal end of the upper arm 66. The pin 63 has an arc shape and is connected to a base board 69. The base board 69 connected to a bottom of the fixing portion 61 rests on the bottom surface of the terminal slot 41. The pin 63 extends over the bottom of the base through the through hole 49. Each of the terminals rests on the bottom surface of the terminal slot 41 through the base board 69, such that the pins of the terminals extend over the bottom of the base and flush with one another and it is advantageous for the terminals to be bonded to the circuit board using the surface mounting method.

The width of the wall notch 48 of the terminal slot is only slightly greater than that of the upper arm 66 of the terminal 60 such that the upper arm 66 of the terminal only can be restricted by the wall notch 48 and thus moved up and down without the leftward and rightward movements. The base board 69 and the pin 63 are formed by prodding and pressing the middle of the board surface of the elastic arm 62 such that the elastic arm 62 is formed with a through hole 601 at the middle part. In addition, as shown in FIG. 9, the manufactured terminals are spaced apart in a manner corresponding to that of the terminal slots 41 and are connected to a material tape 602 to form continuous terminals. The top of the fixing portion 61 is connected to the material tape 602 and formed with a cutting mark 603. After a row of terminals 60 is fitted into the terminal slot 41, the material tape 602 is broken through the cutting mark 603.

The upper cover 70 has a cover surface 71 and two sidewalls 72. Two sides of the rear end of the upper cover 70 have two curved pivot portions 73, and the middle of the rear end has a stopper 74. The pivot portion 73 is pivoted on the second pivot portion 35 of the rear end of the outer seat 30 of the base. The front end of the upper cover 70 has two protrudent pieces 75. The two protrudent pieces 75 are horizontal and protrude forward. When the upper cover 70 covers the base, the cover surface 71 presses the periphery of the chip 90. In addition, when the upper cover 70 is lifted up into a vertical state, the stopper 74 can rest on the rear end of the outer seat 30 and is free from falling out.

Figure 6:
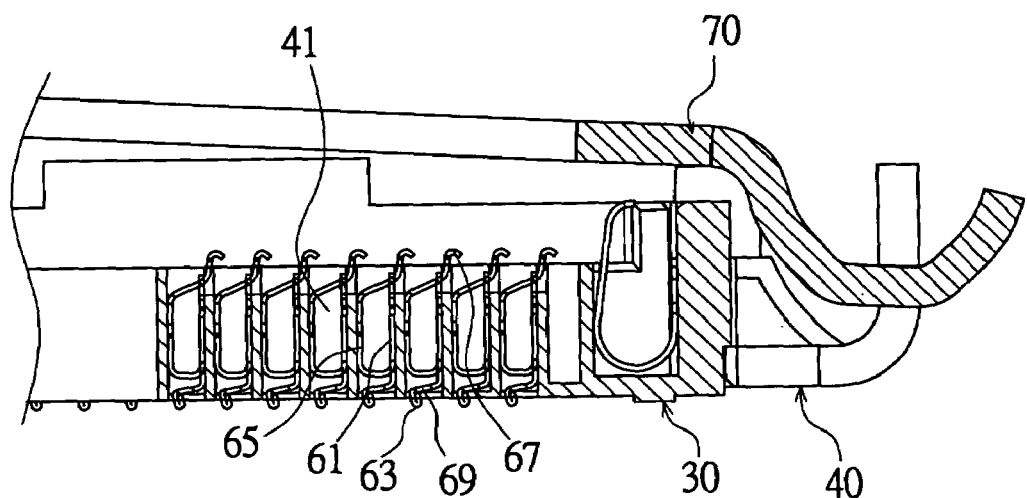
FIG. 6 is a cross-sectional side view showing the electrical connector according to the first embodiment of the invention.

The lever 80 has a first rod 81 and a second rod 82 perpendicular to the first rod 81. The second rod 82 is pivoted on the first pivot portion 34 of the front end of the outer seat 30 of the base, and is curved into a protrudent rod 83. The external end of the first rod 81 is curved to form a handle 84. When the first rod 81 is swung toward the rear end of the base, the protrudent rod 83 can press the protrudent piece 75 of the upper cover 70 to enable the upper cover 70 to press the chip 90 against the plurality of terminals 60 to make the chip 90 be electrically connected to the terminals 60. As shown in FIG. 6, when the lever 80 is swung to the default position, the first rod 81 can be locked by the locking portion 36 of the outer seat 30.

Figure 7:
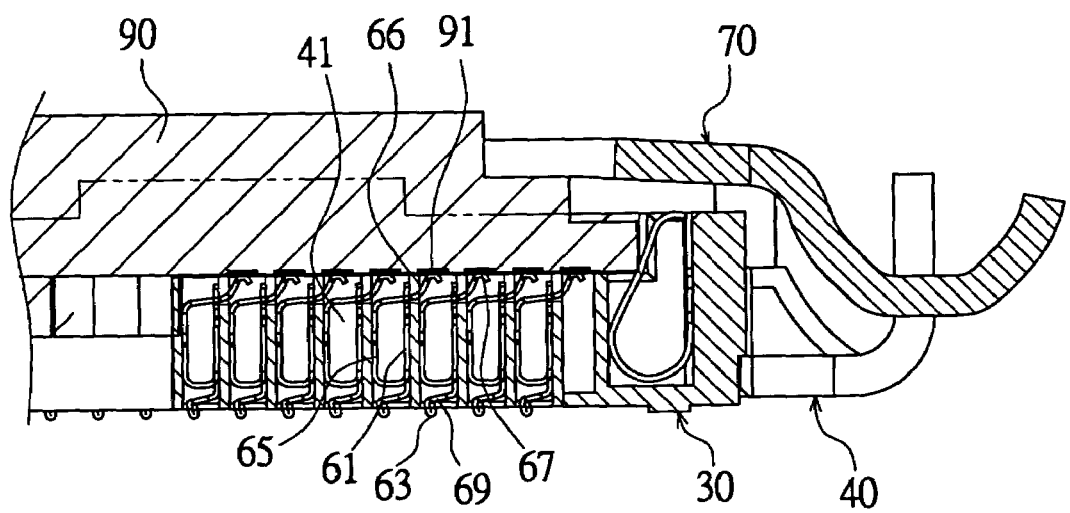
FIG. 7 is a cross-sectional side view showing the usage state of the electrical connector according to the first embodiment of the invention.

According to the above-mentioned structure, because the elastic arm 62 of the terminal 60 extends upwards from the bottom of the fixing portion 61 and includes the lower arm 65 and the upper arm 66, and the upper arm 66 is further extended to the adjacent terminal slot 41, the elastic arm 62 has very good elasticity. As shown in FIG. 7, when the chip 90 is pressed by the upper cover 70 to contact the terminals, the elastic arms 62 of the terminals elastically retract, and the connection points 67 of the terminals can elastically contact the connection points 91 of the chip 90. Although the upper arm 66 of the elastic arm 62 of the terminal extends to the adjacent terminal slot 41, the upper arm 66 is free from contacting the adjacent terminal 41 to cause the short-circuited phenomenon because the upper arm 66 extends slantingly and upwards.

According to the description mentioned hereinabove, the invention has the following advantages.

1. Because the elastic arm 62 of the terminal is very long and the upper arm 66 extends to the adjacent terminal slot 41, the horizontal extending length of the elastic arm 62 can be increased and the elasticity of the overall terminal can be enhanced.

2. The pin 63 and the base board 69 are formed by prodding and pressing the middle of the elastic arm 62, so the material may be saved.

3. The upper arm 66 of the elastic arm 62 of the terminal can be restricted by the wall notch 48 and is free from the leftward and rightward movements, so the connection point 67 can be electrically connected to the connection point 91 of the chip 90 very precisely.

As shown in FIG. 10, the second embodiment of the invention is almost the same as the first embodiment except that the pin 63 of the terminal 60 extends longitudinally.

As shown in FIG. 11, the third embodiment of the invention is almost the same as the first embodiment except that the pin 63 of the terminal 60 is a solder ball, which is not formed by prodding and pressing the middle of the elastic arm. Instead, the solder ball is connected to the bottom of the U-shaped structure formed by the fixing portion 61 and the lower arm 65.

Figure 12:
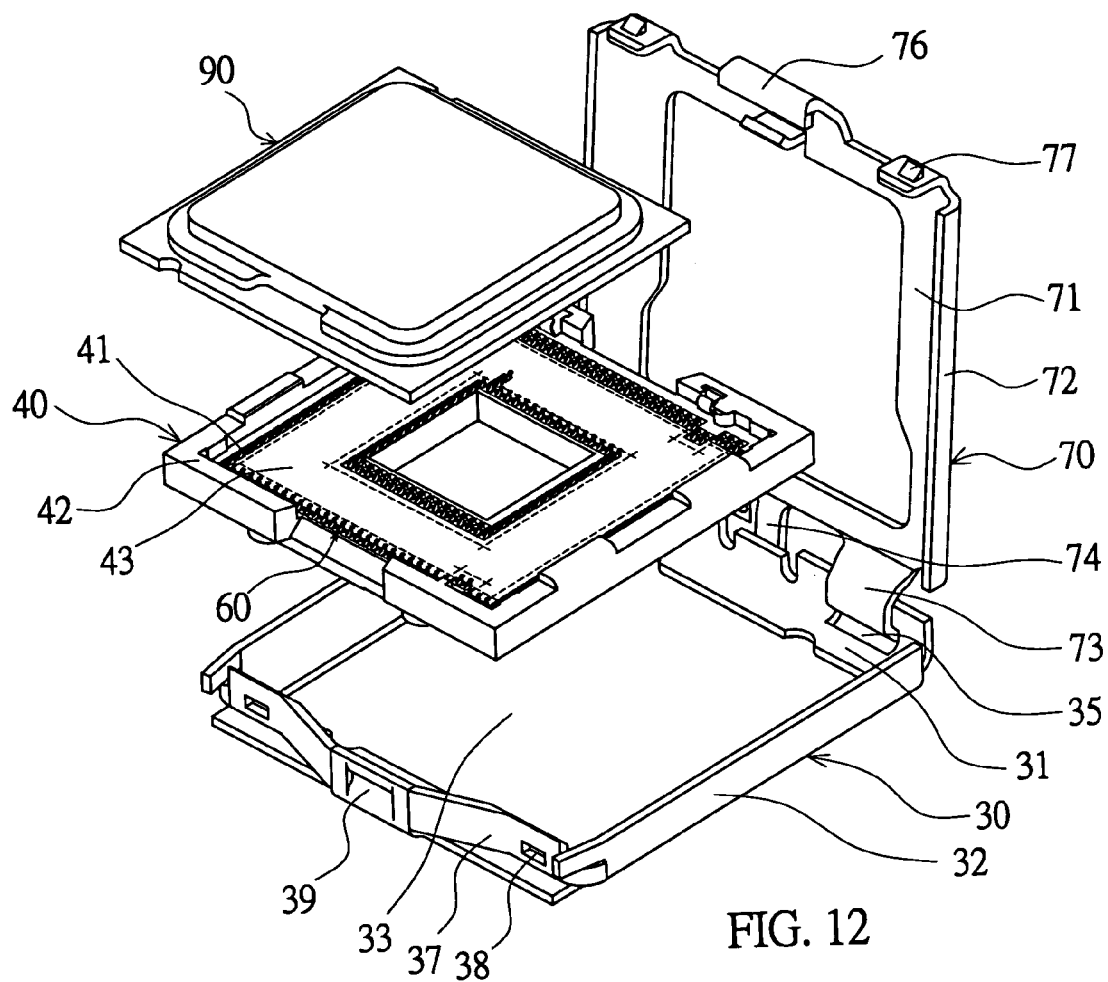
FIG. 12 is a pictorially exploded view showing an electrical connector according to a fourth embodiment of the invention.
Figure 13:
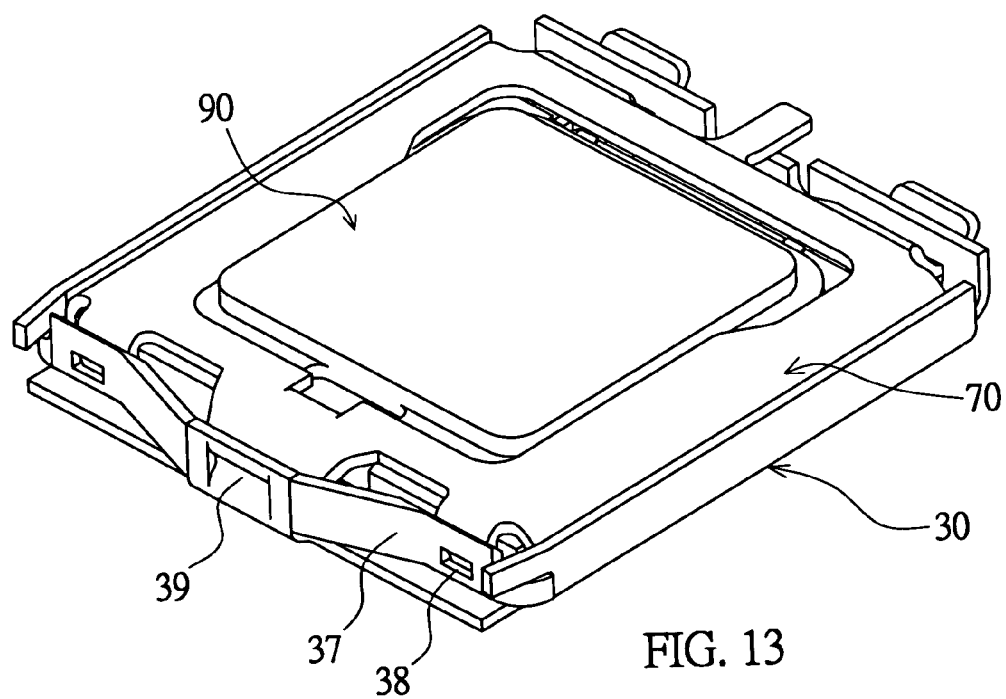
FIG. 13 is a pictorially assembled view showing the electrical connector according to the fourth embodiment of the invention.

As shown in FIGS. 12 and 13, the fourth embodiment of the invention is almost the same as the first embodiment except that the upper cover of this embodiment is directly engaged with the base, and no lever is provided. That is, the middle of the front end of the outer seat 30 of the base is formed with an arc portion 39 projecting toward the rear end. Each of the sides of the arc portion 39 has an elastic engagement arm 37 extending toward the sidewall 32. An engagement portion 38 is formed near the distal end of the elastic engagement arm 37, and the distal end of the arm 37 protrudes over the sidewall 32. The engagement portion 38 is an engagement hole. The middle of the front end of the upper cover 70 is formed with a push block 76, and each of the two sides of the front end of the upper cover 70 is formed with an engagement portion 77, which is an inverse hook. When the chip 90 is placed into the inner seat 40 and then the upper cover 70 covers the outer seat 30, the engagement portion 77 of the upper cover 70 engages with the engagement portion 38 of the outer seat 30 such that the upper cover 70 and the outer seat 30 are positioned. When the chip is to be taken out, the two elastic engagement arms 37 are pulled frontward so that the upper cover 70 disengages with the outer seat 30 such that the cover 70 and the seat 30 can be separated from each other.

Figure 14:
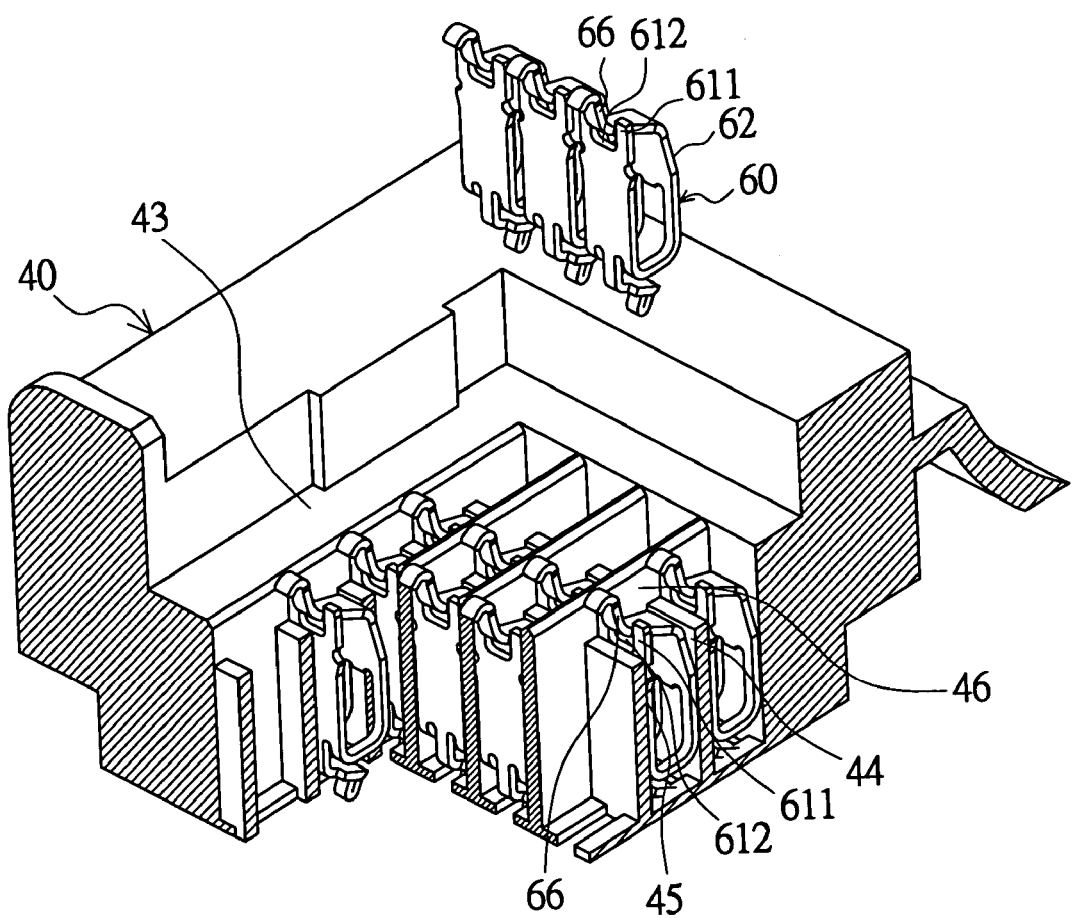
FIG. 14 is a pictorially exploded view showing terminals and an inner seat according to a fifth embodiment of the invention.

As shown in FIG. 14, the fifth embodiment of the invention is almost the same as the first embodiment except that the front and rear walls 44 and 45 of the terminal slot 41 of the inner seat 40 are lower than the sidewall 46 such that the upper arm 66 of the terminal 60 can extend to the adjacent terminal slot 41. Although the front and rear walls 44 and 45 of the terminal slot of this embodiment does not have the wall notch to restrict the left and right positions of the upper arm 66 of the terminal, the upper arm 66 of the terminal passes through the terminal notch 612 above the fixing portion. Thus, the upper arm 66 still can be restricted by the two lateral sides 611 above the fixing portion to prevent the leftward and rightward movements. The front and rear walls 44 and 45 does not have the wall notch, the mold for the plastic injection molding process can be simplified, and the plastic inner seat 40 can be manufactured easily.

Figure 16:
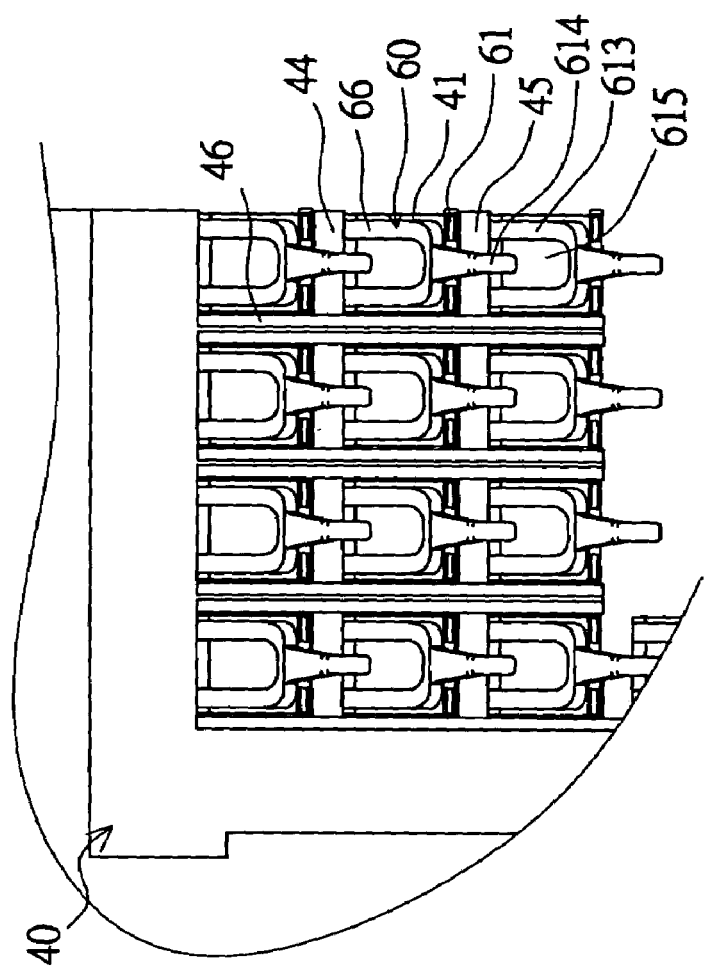
FIG. 16 is an assembled top view showing the terminals and an inner seat according to the sixth embodiment of the invention.
Figure 15:
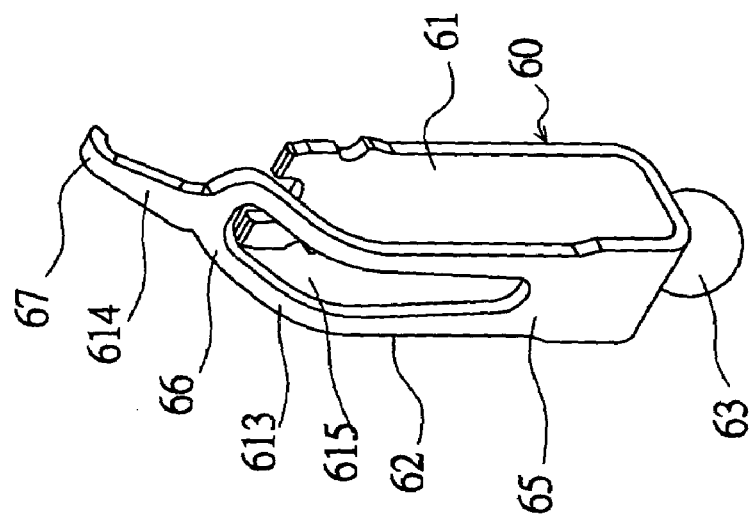
FIG. 15 is a pictorial view showing a terminal according to a sixth embodiment of the invention.

As shown in FIGS. 15 and 16, the sixth embodiment of the invention is almost the same as the fifth embodiment except that the lower section of the upper arm 66 of the elastic arm 62 of the terminal 60 of this embodiment is a wide board 613, and the upper section of the arm 66 is a narrow board 614 narrower than the wide board. A connection point 67 is formed near a distal end of the narrow board 614. The wide board 613 extends to a position close to the top of the fixing portion 61, and the wide board 613 and the upper section of the lower arm 65 have the same width. A long through hole 615 is formed between the wide board 613 and the upper section of the lower arm 65. The narrow board 614 of the upper arm of the terminal corresponds to the through hole 615 of the wide board 613 of the terminal 60 in the adjacent terminal slot 41. The pin 63 is a solder ball connected to the bottom of the U-shaped structure formed by the fixing portion 61 and the lower arm 65.

According to the above-mentioned structure, the wide board 613 of the upper arm 66 of the elastic arm of this embodiment is formed by bending a wide board, which has substantially the same width as the fixing portion 61. Only the upper section of the upper arm 66 is formed with a small section of narrow board 614, so the upper arm 66 of the elastic arm 62 can possess better stability and the leftward and rightward movements can be avoided such that the connection point 67 can be well positioned. In addition, when the connection point 67 is electrically connected to the chip such that the upper arm 66 is pressed down, the front and rear terminals 60 are free from being short-circuited even if the vertical heights of the upper arms 66 are not well controlled because the narrow board 614 corresponds to the through hole 615 of the wide board 613 of the terminal 60 in the adjacent terminal slot 41.

While the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrical connector, comprising:
    a base formed with a plurality of terminal slots spaced apart from one another; and
    a plurality of terminals respectively disposed in the plurality of terminal slots of the base, wherein each of the terminals has a fixing portion, an elastic arm and a pin, the fixing portion is clamped and positioned by the terminal slot, the elastic arm has a lower arm and an upper arm, a bottom of the lower arm is connected to a bottom of the fixing portion, the lower arm extends from bottom to top, a top of the lower arm and the fixing portion define a gap, the upper arm in one of the terminal slots extends, from the top of the lower arm, slantingly upwards through a top of the fixing portion to the adjacent terminal slot adjacent to the one of the terminal slots, a connection point is disposed near a distal end of the upper arm, and the pin is positioned under the fixing portion and extends over a bottom of the base.

2. The electrical connector according to claim 1, wherein each of the terminal slots has an upper edge formed with a wall notch communicating with the adjacent terminal slot, and the upper arm of each of the terminals extends from the wall notch to the adjacent terminal slot.

3. The electrical connector according to claim 1, wherein the lower arm of the terminal and the fixing portion form a U-shaped structure.

4. The electrical connector according to claim 1, wherein the fixing portion of the terminal rests on one wall of the terminal slot, and the lower arm rests on another wall of the terminal slot opposite to the one wall.

5. The electrical connector according to claim 2, wherein a width of the wall notch of the terminal slot is only slightly greater than a width of the upper arm of the terminal such that the upper arm of the terminal is restricted by the wall notch and only can be moved up and down without leftward and rightward movements.

6. The electrical connector according to claim 1, wherein a top of the fixing portion of the terminal has two lateral sides and a terminal notch between the two lateral sides, the upper arm of the elastic arm of the terminal passes through the terminal notch, and the two lateral sides restrict leftward and rightward movements of the upper arm.

7. The electrical connector according to claim 1, wherein:
    a top of the base is formed with a placement area in which a chip is placed, and the connection points of the plurality of terminals project over the terminal slot to the placement area;
    the base comprises an upper cover having a rear end and a front end;
    the rear end of the upper cover is pivoted on a rear end of the base, and the front end of the upper cover has a horizontal protrudent piece for pressing the chip when the upper cover covers the base; and
    the base comprises a lever having a first rod and a second rod perpendicular to the first rod, wherein the second rod is pivoted on the front end of the base and is curved into a protrudent rod for pressing the protrudent piece of the upper cover when the first rod is swung to the rear end of the base.

8. The electrical connector according to claim 7, wherein the base comprises a metallic outer seat and a plastic inner seat, the inner seat is fitted in the outer seat, the plurality of terminal slots and the placement area are disposed on the inner seat, and the lever and the upper cover are pivoted on front and rear ends of the outer seat, respectively.

9. The electrical connector according to claim 1, wherein:
a top of the base is formed with a placement area in which a chip is placed;
the connection points of the plurality of terminals protrude from the terminal slots to the placement area;
the base comprises an upper cover, which has a rear end pivoted on a rear end of the base and a front end having an engagement portion;
a front end of the base has an elastic engagement arm having an engagement portion; and
when the upper cover covers the base, the chip is pressed down and the engagement portion of the upper cover engages with the engagement portion of the elastic engagement arm of the base.

10. The electrical connector according to claim 9, wherein the base comprises a metallic outer seat and a plastic inner seat, the inner seat is fitted in the outer seat, the plurality of terminal slots and the placement area are disposed on the inner seat, and the upper cover is pivoted on a rear end of the outer seat.

11. The electrical connector according to claim 1, wherein the pin of the terminal has an arc shape and is connected to a base board, which is connected to the bottom of the fixing portion.

12. The electrical connector according to claim 3, wherein the pin of the terminal is connected to a bottom of the U-shaped structure via a solder ball.

13. The electrical connector according to claim 1, wherein the upper arm has a lower section in the form of a wide board, and an upper section in the form of a narrow board narrower than the wide board, and the wide board is formed with a through hole.

14. The electrical connector according to claim 13, wherein the narrow board corresponds to the through hole of the wide board of the terminal in the adjacent terminal slot.

15. A terminal structure to be disposed in a terminal slot of an electrical connector, the terminal structure comprising:
a fixing portion clamped and positioned by the terminal slot;
an elastic arm having a lower arm and an upper arm, wherein a bottom of the lower arm is connected to a bottom of the fixing portion and the lower arm extends from bottom to top, a top of the lower arm and the fixing portion define a gap, the upper arm in the terminal slot extends, from the top of the lower arm, slantingly upwards through a top of the fixing portion, and a connection point is disposed near a distal end of the upper arm; and
a pin positioned under the fixing portion.

16. The terminal structure according to claim 15, wherein the lower arm and the fixing portion form a U-shaped structure.

17. The terminal structure according to claim 15, wherein a top of the fixing portion has two lateral sides and a terminal notch between the two lateral sides, the upper arm of the elastic arm of the terminal passes through the terminal notch, and the two lateral sides restrict leftward and rightward movements of the upper arm.

18. The terminal structure according to claim 15, wherein the pin of the terminal has an arc shape and is connected to a base board, which is connected to the bottom of the fixing portion.

19. The terminal structure according to claim 16, wherein the pin of the terminal is connected to a bottom of the U-shaped structure via a solder ball.

20. The terminal structure according to claim 15, wherein:
the upper arm has a lower section in the form of a wide board, and an upper section in the form of a narrow board narrower than the wide board, and the wide board is formed with a through hole; and
the narrow board corresponds to the through hole of the wide board of the terminal in an adjacent terminal slot adjacent to the terminal slot.

* * * * *